(12) United States Patent
Sudradjat et al.

(10) Patent No.: US 10,062,817 B1
(45) Date of Patent: Aug. 28, 2018

(54) ULTRAVIOLET EMITTING DEVICE WITH SHAPED ENCAPSULANT

(71) Applicant: RayVio Corporation, Hayward, CA (US)

(72) Inventors: Faisal Sudradjat, Hayward, CA (US); Saijin Liu, Hayward, CA (US); Douglas A. Collins, Hayward, CA (US)

(73) Assignee: RayVio Corporation, Hayward, CA (US)

( * ) Notice: Subject to any disclaimer, the term of this patent is extended or adjusted under 35 U.S.C. 154(b) by 0 days.

(21) Appl. No.: 15/402,621

(22) Filed: Jan. 10, 2017

(51) Int. Cl.
| | | |
|---|---|---|
| *H01L 33/54* | (2010.01) |
| *H01L 33/56* | (2010.01) |
| *H01L 33/60* | (2010.01) |
| *H01L 33/48* | (2010.01) |
| *H01L 33/52* | (2010.01) |

(52) U.S. Cl.
CPC ............ *H01L 33/54* (2013.01); *H01L 33/486* (2013.01); *H01L 33/52* (2013.01); *H01L 33/56* (2013.01); *H01L 33/60* (2013.01)

(58) Field of Classification Search
CPC ....... H01L 33/486; H01L 33/52; H01L 33/54; H01L 33/56; H01L 33/48; H01L 33/483
See application file for complete search history.

(56) References Cited

U.S. PATENT DOCUMENTS

| | | | | |
|---|---|---|---|---|
| 2004/0119668 A1* | 6/2004 | Homma | .................. | H01L 33/54 345/82 |
| 2005/0017259 A1* | 1/2005 | Han | ....................... | H01L 33/54 257/99 |
| 2008/0023711 A1* | 1/2008 | Tarsa | .................... | H01L 33/486 257/98 |
| 2012/0181559 A1* | 7/2012 | Park | ........................ | H01L 33/58 257/98 |
| 2013/0329429 A1* | 12/2013 | Lowes | ...................... | F21K 9/54 362/247 |
| 2016/0247984 A1* | 8/2016 | Liu | ......................... | H01L 33/58 |

\* cited by examiner

*Primary Examiner* — Robert Bachner
*Assistant Examiner* — Molly Reida
(74) *Attorney, Agent, or Firm* — Patent Law Group LLP; Brian D. Ogonowsky

(57) ABSTRACT

Embodiments of the invention include a light emitting diode (UVLED), the UVLED including a semiconductor structure with an active layer disposed between an n-type region and a p-type region. The active layer emits UV radiation. The UVLED is disposed on a mount. A transparent encapsulant is disposed over the UVLED. The transparent encapsulant has an angled sidewall.

14 Claims, 4 Drawing Sheets

ULTRAVIOLET EMITTING DEVICE WITH SHAPED ENCAPSULANT

BACKGROUND

Description of Related Art

The bandgap of III-nitride materials, including (Al, Ga, In)—N and their alloys, extends from the very narrow gap of InN (0.7 eV) to the very wide gap of AlN (6.2 eV), making III-nitride materials highly suitable for optoelectronic applications such as light emitting diodes (LEDs), laser diodes, optical modulators, and detectors over a wide spectral range extending from the near infrared to the deep ultraviolet. Visible light LEDs and lasers can be obtained using InGaN in the active layers, while ultraviolet LEDs (UVLEDs) and lasers require the larger bandgap of AlGaN.

UVLEDs with emission wavelengths in the range of 230-350 nm are expected to find a wide range of applications, most of which are based on the interaction between UV radiation and biological material. Typical applications include surface sterilization, air disinfection, water disinfection, medical devices and biochemistry, light sources for ultra-high density optical recording, white lighting, fluorescence analysis, sensing, and zero-emission automobiles.

The extraction efficiency from such UVLEDs is often undesirably low.

DETAILED DESCRIPTION

Figure 1:
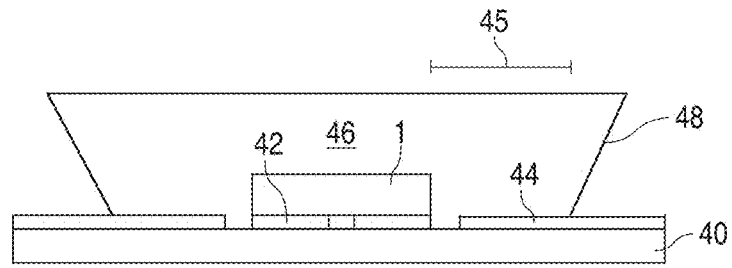
FIG. 1 is a cross sectional view of a UV-emitting device (UVLED) disposed on a mount and covered with a shaped encapsulant.

Though the devices described herein are III-nitride devices, devices formed from other materials such as other III-V materials, II-VI materials, Si are within the scope of embodiments of the invention. The devices described herein may be configured to emit visible, UV A (peak wavelength between 340 and 400 nm), UV B (peak wavelength between 290 and 340 nm), or UV C (peak wavelength between 210 and 290 nm) radiation. The radiative power emitted by the UVLEDs described herein may be described as "light" for economy of language.

Embodiments of the invention are directed to structures and techniques for increasing the extraction efficiency from UVLEDs.

FIGS. 1, 4, 5, 8, 9, and 10 are cross sectional views of UVLEDs 1 attached to a mount, and covered with an encapsulant, according to embodiments of the invention. The encapsulant may be shaped, as described below.

In each of FIGS. 1, 4, 5, 8, 9, and 10, the UVLED 1 is attached to a mount 40. Mount 40 may be any suitable material that is highly thermally conductive (for example, with a thermal conductivity of at least 170 W/mK in some embodiments), highly electrically insulating, and mechanically rigid (for example, with a coefficient of thermal expansion that matches or is close to that of UVLED 1). Examples of suitable materials for mount 40 include but are not limited to ceramic, diamond, AlN, beryllium oxide, silicon or electrically conductive material such as silicon, metal, alloy, Al, or Cu, provided the electrically conductive material is appropriately coated with an insulating layer such as silicon oxide, silicon nitride or aluminum oxide, or any other suitable material. In some embodiments, circuitry and/or other structures such as transient voltage suppression circuitry, driver circuitry, or any other suitable circuitry may be disposed within mount 40, or mounted on a surface of mount 40, such that the circuitry or other structures are electrically connected to UVLED 1, if necessary.

In each of FIGS. 1, 4, 5, 8, 9, and 10, conductive pads 42 are formed on the top surface of the mount. UVLED 1 is electrically and physically connected to mount 40 through pads 42. At least two electrically isolated pads 42 are provided per UVLED 1, one coupled to the n-type region of the UVLED 1 and one coupled to the p-type region of the UVLED 1. Pads 42 may be, for example, any material that is suitable for bonding UVLED 1 including, for example, gold, silver, tin-silver-copper (SAC), or gold-tin (AuSn). Pads 42 may be formed on the surface of mount 40 by any suitable technique including, for example, plating.

The contacts of UVLED 1 (described below) are connected to pads 42 by an interconnect (not shown), which may be any suitable material such as, for example, solder or gold. UVLED 1 may be connected to pads 42 by any suitable technique including, for example, gold-gold interconnection, soldering, or flux-assisted eutectic reflow techniques.

In each of FIGS. 1, 4, 5, 8, 9, and 10, the area on the mount 40 surrounding UVLED 1 may be reflective. In some embodiments, the surface of the mount is reflective. In some embodiments, the mount is coated with a reflective layer 44. Reflective layer 44 is a material that is highly reflective to the radiative power emitted by UVLED 1. Reflective layer 44 may be any suitable material including, for example, a metal, aluminum, multi-layer metal stacks, alloys, a dielectric, multi-layer dielectric stacks, multi-layer metal and dielectric stacks, or reflective particles such as Polytetrafluoroethylene (PTFE, which may be known by the trade name Teflon®) or aluminum oxide disposed in a transparent material, such as UV-resistant silicone. Reflective layer 44 is at least 70% reflective of radiative power with wavelengths between 250 and 350 nm in some embodiments, and at least 85% reflective of radiative power with wavelengths between 250 and 350 nm in some embodiments.

A metal reflective layer 44 such as aluminum may be formed by, for example, plating, electron beam deposition, or evaporation. Reflective layer 44 may be a metal stack. For example, one or more layers that facilitate adhesion of the metal reflective layer 44 to the underlying surface (for example, a surface of mount 40 and/or a surface of pads 42) may be formed prior to metal reflective layer 44. Examples of such adhesion layers include nickel, titanium, or alloys thereof. One example of a suitable metal stack is 100 nm Ti disposed in direct contact with the underlying surface, followed by 500 nm Al. The metal stack may be formed by any suitable technique. In one embodiment, the metal stack can be formed by e-beam deposition, and the pattern can be formed by a photoresist lift-off process as is known in the art.

A reflective layer 44 that is reflective particles disposed in a transparent material may be formed by, for example, dispensing, molding, stencil printing, screen printing, or any other suitable technique. Reflective particles may be $Al_2O_3$, polytetrafluoroethylene (PTFE), or Al, disposed in silicone or any other suitable material that is low index, UV-resistant, and transparent to light between for example 250 nm and 350 nm. In some embodiments, the transparent material is electrically insulating. In some embodiments, the difference in refractive index between the particles and the transparent material causes scattering of light incident on the reflective layer 44. For example, commercially available UV-suitable silicone (such as, for example, Schott UV-200) may have a refractive index of no more than 1.42. $Al_2O_3$ particles may have a refractive index of 1.8. The difference between 1.42 and 1.8 may cause suitable scattering. The particles may be micron sized or nanometer sized.

Reflective layer 44 may improve extraction from the device.

In each of FIGS. 1, 4, 5, 8, 9, and 10, UVLED 1 is covered with an encapsulant 46. Encapsulant 46 may protect UVLED 1, for example from moisture, may protect wire bonds formed to UVLED 1 (if used), for example from breakage or failure, and may protect metal layers on or adjacent UVLED 1, for example from oxidation. Encapsulant 46 may be, for example, UV-resistant silicone, fused silica, glass, IHU UV transmissive glass available from Isuzu Glass, Inc., quartz, or sapphire. Depending on the material, encapsulant 46 may be formed over UVLED 1 by dispensing, molding, spin coating, or spraying a liquid or semi-solid over the UVLED 1, then curing, or forming a pre-formed encapsulant separate from UVLED 1, for example by molding or grinding and polishing, or by any other suitable technique. The thickness of the encapsulant, i.e. the distance between the top surface of encapsulant 46 and the top surface of reflective layer 44 may be at least 500 μm in some embodiments, no more than 2 mm in some embodiments, at least 750 μm in some embodiments, and no more than 1 mm in some embodiments. In the examples below, encapsulant 46 is, for example, a silicone layer.

In each of FIGS. 1, 4, 5, 8, 9, and 10, the sidewall 48 of encapsulant 46 is shaped. The examples illustrated in FIGS. 1, 4, 5, 8, 9, and 10 need not have shaped sidewalls in some embodiments, and in some embodiments, in a single device, only some of the sidewalls are shaped. As illustrated, the sidewall is shaped such that rather than a vertical sidewall, the sidewall slopes inward, such that the encapsulant is wider at the top surface than at the bottom surface (the bottom surface being in contact with the top surface of the mount). Though an inward angle is illustrated, the sidewall may also angle outward from top to bottom, such that the encapsulant is wider at the bottom surface. As illustrated, the sidewall is angled, such that the sidewall forms an acute angle with the top surface of the mount. The angle may be, for example, at least 30° in some embodiments, at least 45° in some embodiments, no more than 60° in some embodiments, and less than 90° in some embodiments. As illustrated, the angled sidewall is flat. In some embodiments, the sidewall may be curved (convex or concave), or may include a curved portion and a flat portion. In some embodiments, the sidewall has more than one profile. For example, a top section of the sidewall may be angled, and a bottom section of the sidewall may be vertical; a top section of the sidewall may be vertical, and a bottom section of the sidewall may be angled; a top section of the sidewall may be curved, and a bottom section of the sidewall may be vertical; a top section of the sidewall may be vertical, and a bottom section of the sidewall may be curved; a top section of the sidewall may be angled, and a bottom section of the sidewall may be curved; or a top section of the sidewall may be curved, and a bottom section of the sidewall may be angled. Any other suitable non-vertical sidewall may be used.

In some embodiments, all, none, or a portion of the top surface of encapsulant 46 may be textured, for example by roughening or by patterning. The texturing may improve light extraction from the encapsulant 46. In some embodiments, the top surface of the encapsulant 46 is formed into a lens or other suitable structure. In some embodiments, particles the cause scattering are mixed with the encapsulant. In some embodiments, other particles are mixed with the encapsulant, such as particles that adjust the index of refraction of the encapsulant or other properties of the encapsulant.

Bond pads (not shown) may be formed on the top surface of the mount, to facilitate electrical connection between UVLED 1 and another structure. Bond pads must be electrically connected to pads 42. If reflective layer 44 is conductive (such as, for example, aluminum), bond pads may be formed on reflective layer 44. In some embodiments, the reflective layer 44 may be formed over the bond pads, then removed by, for example, etching or any other suitable technique, to expose the bond pads.

Figure 2:
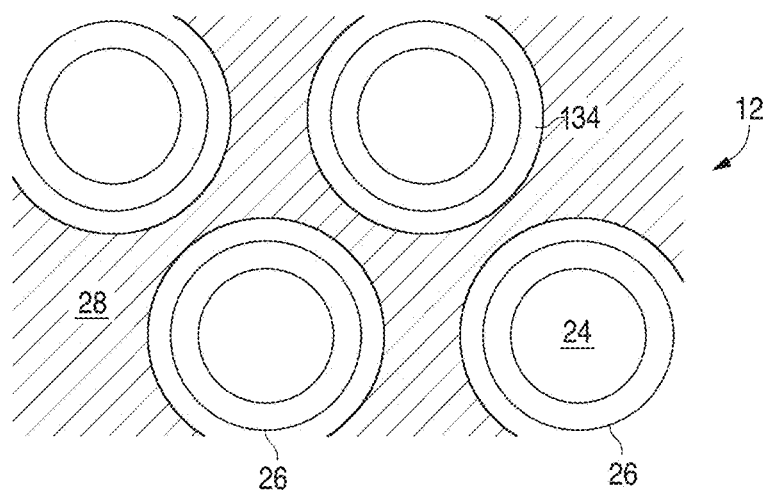
FIG. 2 is a plan view of multiple pixels in a flip chip UVLED.
Figure 3:
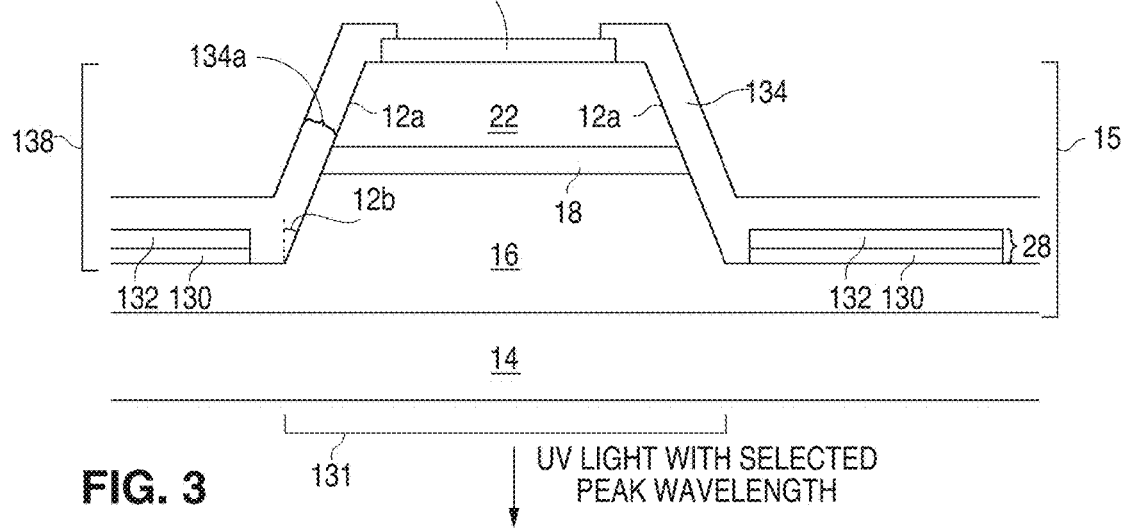
FIG. 3 is a cross sectional view of one pixel in the UVLED.

In each of FIGS. 1, 4, 5, 8, 9, and 10, the UVLED 1 attached to the mount may be a commercially available UVA, UVB, and UVC LEDs in the various embodiments. FIGS. 2 and 3 illustrate a portion of one example of the assignee's own UVB and UVC LEDs, which may be used in embodiments of the invention. FIG. 2 is a top down view of a portion of a UVLED composed of an array of UVLED pixels 12. FIG. 3 is a bisected cross-section of a single UVLED pixel 12. Any suitable UVLED may be used and embodiments of the invention are not limited to the structures illustrated in FIGS. 2 and 3.

The UVLEDs are typically III-nitride, and commonly GaN, AlGaN, and InGaN. The array of UV emitting pixels 12 is formed on a single substrate 14, such as a transparent sapphire substrate. Other substrates are possible. Although the example shows the pixels 12 being round, they may have any shape, such as square. The light escapes through the transparent substrate, as shown in FIG. 3. The pixels 12 may each be flip-chips, where the anode and cathode electrodes face the mount.

Semiconductor layers are epitaxially grown over the substrate 14. (The device may include one or more semiconductor layers, such as conductive oxides such as indium tin oxide, that are not epitaxially grown, but are deposited or otherwise formed.) An AlN or other suitable buffer layer (not shown) is grown, followed by an n-type region 16. The n-type region 16 may include multiple layers of different compositions, dopant concentrations, and thicknesses. The n-type region 16 may include at least one $Al_aGa_{1-a}N$ film doped n-type with Si, Ge and/or other suitable n-type dopants. The n-type region 16 may have a thickness from about 100 nm to about 10 microns and is grown directly on the buffer layer(s). The doping level of Si in the n-type region 16 may range from $1\times10^{16}$ $cm^{-3}$ to $1\times10^{21}$ $cm^{-3}$.

Depending on the intended emission wavelength, the AlN mole fraction "a" in the formula may vary from 0% for devices emitting at 360 nm to 100% for devices designed to emit at 200 nm.

An active region 18 is grown over the n-type region 16. The active region 18 may include either a single quantum well or multiple quantum wells (MQWs) separated by barrier layers. The quantum well and barrier layers contain $Al_xGa_{1-x}N/Al_yGa_{1-y}N$, wherein $0<x<y<1$, x represents the AlN mole fraction of a quantum well layer, and y represents the AlN mole fraction of a barrier layer. The peak wavelength emitted by a UV LED is generally dependent upon the relative content of Al in the AlGaN quantum well active layer.

A p-type region 22 is grown over the active region 18. Like the n-type region 16, the p-type region 22 may include multiple layers of different compositions, dopant concentrations, and thicknesses. The p-type region 22 includes one or more p-type doped (e.g. Mg-doped) AlGaN layers. The AlN mole fraction can range from 0 to 100%, and the thickness of this layer or multilayer can range from about 2 nm to about 100 nm (single layer) or to about 500 nm (multilayer). A multilayer used in this region can improve lateral conductivity. The Mg doping level may vary from $1\times10^{16}$ cm$^{-3}$ to $1\times10^{21}$ cm$^{-3}$. A Mg-doped GaN contact layer may be grown last in the p-type region 22.

All or some of the semiconductor layers described above may be grown under excess Ga conditions, as described in more detail in US 2014/0103289, which is incorporated herein by reference.

The semiconductor structure 15 is etched to form trenches between the pixels 12 that reveal a surface of the n-type region 16. The sidewalls 12a of the pixels 12 may be vertical or sloped with an acute angle 12b relative to a normal to a major surface of the growth substrate. The height 138 of each pixel 12 may be between 0.1-5 microns. The widths 131 and 139 at the bottom and top of each pixel 12 may be at least 5 microns in some embodiments and no more than 200 microns in some embodiments. Other dimensions may also be used.

Before or after etching the semiconductor structure 15 to form the trenches, a metal p-contact 24 is deposited and patterned on the top of each pixel 12. The p-contact 24 may include one or more metal layers that form an ohmic contact, and one or more metal layers that form a reflector. One example of a suitable p-contact 24 includes a Ni/Ag/Ti multi-layer contact.

An n-contact 28 is deposited and patterned, such that n-contact 28 is disposed on the substantially flat surface of the n-type region 16 between the pixels 12. The n-contact 28 may include a single or multiple metal layers. The n-contact 28 may include, for example, an ohmic n-contact 130 in direct contact with the n-type region 16, and an n-trace metal layer 132 formed over the ohmic n-contact 130. The ohmic n-contact 130 may be, for example, a V/Al/Ti multi-layer contact. The n-trace metal 132 may be, for example, a Ti/Au/Ti multi-layer contact.

The n-contact 28 and the p-contact 24 are electrically isolated by a dielectric layer 134. Dielectric layer 134 may be any suitable material such as, for example, one or more oxides of silicon, and/or one or more nitrides of silicon, formed by any suitable method. Dielectric layer 134 covers n-contact 28. Openings formed in dielectric layer 134 expose p-contact 24.

A p-trace metal 136 is formed over the top surface of the device, and substantially conformally covers the entire top surface. The p-trace metal 136 electrically connects to the p-contact 24 in the openings formed in dielectric layer 134. The p-trace metal 136 is electrically isolated from n-contact 28 by dielectric layer 134.

FIG. 2 is a top view of four of the pixels illustrated in FIG. 3. The p-trace metal 36, which covers the entire surface, is omitted for clarity. The p-contact 24 is smaller than and substantially concentric with the edge 26 of the mesa that forms each pixel 12. The n-contact 28 is disposed in the region between the pixels 12. Except for openings in the n-contact 28 to accommodate the pixels, the n-contact 28 forms a continuous sheet, which extends to the edge of the device into n-contact pad (not shown). The n-contact 28 and p-contact 24 are electrically isolated by dielectric layer 134, which extends over the sidewalls of each pixel, as illustrated in FIG. 3.

Robust metal pads electrically connected to the p-trace metal 136 and n-contact 28 are provided outside of the drawing for connection to the mount. Multiple pixels 12 are included in a single UVLED. The pixels are electrically connected by large area p-trace metal 136 and the large area n-trace metal 132. The number of pixels may be selected based on the application and/or desired radiation output. A single UVLED, which includes multiple pixels, is illustrated in the following figures as UVLED 1.

In some embodiments, substrate 14 is sapphire. Substrate 14 may be, for example, on the order of a hundred of microns thick. Substrate 14 may remain part of the device in some embodiments, and may be removed from the semiconductor structure in some embodiments.

The UVLED may be square, rectangular, or any other suitable shape when viewed from the top surface of substrate 14, when the device is flipped relative to the orientation illustrated in FIG. 3. The length of the UVLED may be, for example, at least 150 µm in some embodiments, and no more than 1 mm in some embodiments.

FIG. 1 illustrates a device with an encapsulant with a shaped sidewall. A device such as the device illustrated in FIG. 1 exhibited increased optical gain, as compared to a device where the sidewall of the encapsulant is not shaped. In some embodiments, the closer the shaped sidewall is to the UVLED 1, the larger the optical gain observed from the shaped sidewall. The spacing 45 between an edge of the UVLED 1 and the shaped sidewall may be, for example, at least 0 mm in some embodiments, no more than 1 mm in some embodiments, at least 0.1 mm in some embodiments, no more than 0.5 mm in some embodiments, and at least 0.2 mm in some embodiments.

Figure 4:
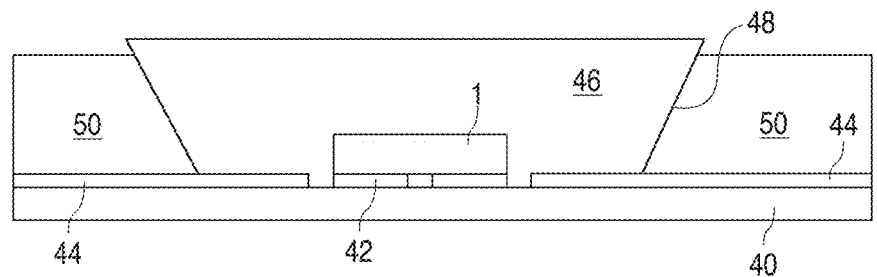
FIG. 4 is a cross sectional view of a UVLED covered with a shaped encapsulant, with a reflective material disposed adjacent the encapsulant.

In the device of FIG. 4, a reflective material 50 is disposed adjacent and outside the encapsulant 46. The reflective material 50 may surround the encapsulant 46. The reflective material 50 may be, for example, any of the materials described above in the description of reflective layer 44. The reflective material may be substantially the same thickness as encapsulant 46 in some embodiments, though in various embodiments the top surface of reflective material 50 may be at the same level as the top surface of encapsulant 46, higher than encapsulant 46, or lower than encapsulant 46 (as illustrated in FIG. 4). In some embodiments, circuitry or other structures that may be absorbing to the radiative power emitted by UVLED 1, such as an electrostatic discharge protection chip, are disposed outside the encapsulant 46, for example under the reflective material 50.

Figure 5:
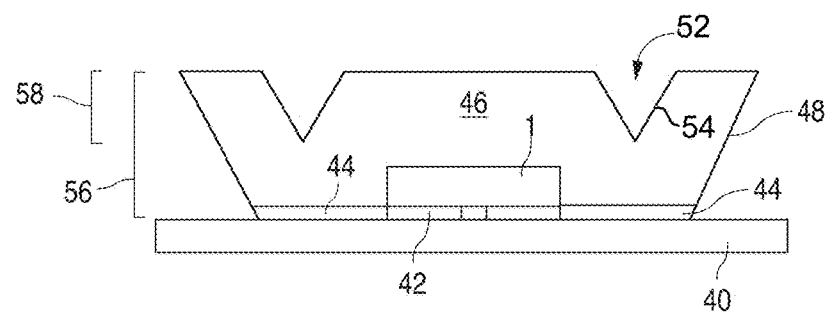
FIG. 5 is a cross sectional view of a UVLED covered with a shaped encapsulant.
Figure 6:
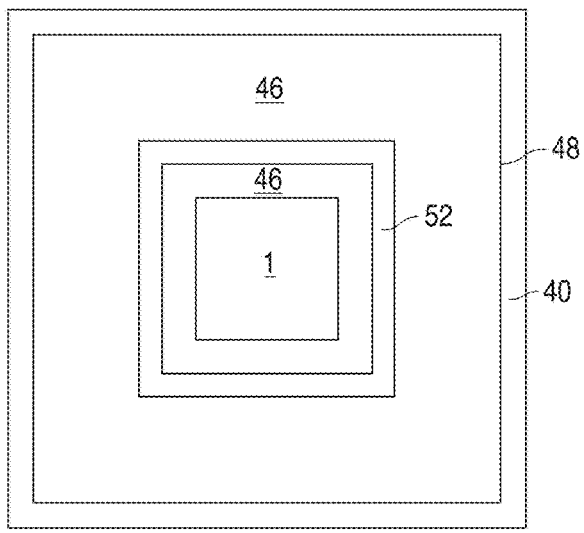
FIG. 6 is a top view of the device of FIG. 5.

In the device of FIG. 5, features are formed in the top surface of the encapsulant 46. The features may be, for example, one or more trenches 52 formed in the top surface of the encapsulant 46. FIG. 6 is a top view of the device of FIG. 5. A trench 52 surrounds UVLED 1. The trench 52 includes four segments that connect and make a square. The trench illustrated in FIG. 5 has angled, straight sidewalls that meet at a point at the bottom of the trench, though this is not required. The sidewalls may be vertical or curved, and the sidewalls need not meet in a point. Other arrangements besides a square that surrounds the UVLED 1 may be used, such as segments that are not connected, segments that are not parallel to an edge of the UVLED 1, segments that are oriented in directions other than the directions shown, or any other suitable arrangement.

Other features besides trenches may be used, such as, for example, holes formed in the top surface, structures formed on the top surface, or any other suitable feature. Holes may be formed, for example, in a line, in an array, or in a random pattern. Holes may be formed in one or more regions on the top surface. A region without holes may separate different regions with holes, and/or surround one or more regions with holes.

In some embodiments, the features are created by roughening of the top surface, for example randomly or by patterning. Like the holes described above, a rough area may be formed in a line, or in a two dimensional region. A region without roughening may separate different regions with roughening, and/or surround one or more regions with roughening.

The features may extend from the top surface downward. The depth 58 of the features 52 may be at least 20% of the thickness 56 of the encapsulant in some embodiments, no more than 80% of the thickness in some embodiments, at least 40% of the thickness in some embodiments, and no more than 60% of the thickness in some embodiments.

In some embodiments, different types of features may be combined. In various embodiments, for example, the trench illustrated in FIGS. 5 and 6 may be combined with, for example, roughening and/or holes formed in a different area of the top surface; a top surface may be formed with holes and roughening in the same or different areas; and any of the above-described combinations may include regions of the top surface without any features.

Figure 7:
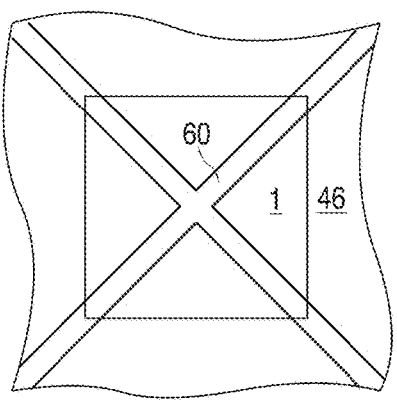
FIG. 7 is a top view of a device with features formed in the encapsulant over the UVLED.

In the device of FIGS. 5 and 6, the features 52 are disposed in the encapsulant 46 away from UVLED 1. In the device illustrated in FIG. 7, features 60, which may be features such as the features illustrated in FIGS. 5 and 6, holes, roughening, or any other type of features described in the accompanying text, are formed over UVLED 1. Features formed over the UVLED 1 are not limited to the arrangement shown in FIG. 7.

The angled sidewalls 48 and features 52, 60 may be formed by any suitable technique, including cutting with a razor blade or pizza cutter, with or without guides, cutting with a hula hoe, sawing with an angled or otherwise shaped blade, casting, patterning to form areas of weak adhesion of the encapsulant, using a breaker with the desired profile or by tilting the structure to get a cut at the desired angle, laser cutting, stamping, molding, abrading, cutting, using tape or an air brush to remove portions of the encapsulant. In some embodiments, the angled sidewalls 48 and/or the features 52, 60 are formed within a layer of encapsulant, rather than by removing or shaping the encapsulant. For example, multiple silicones with different indices of refraction may be used to form feature 52. The encapsulant 46 may be one silicone, and the feature 52, rather than being filled with ambient gas, may be filled with a second silicone with a different index of refraction. Many of the above described techniques for forming angled sidewalls and features may be automated.

Figure 11:
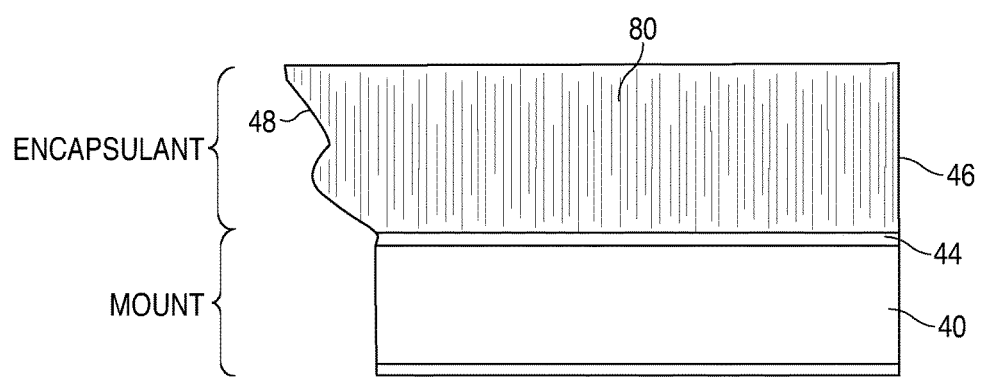
FIG. 11 is a photograph of a portion of a UVLED covered with a shaped encapsulant.

In some embodiments, grooves are formed on the sidewalls 48 of the encapsulant 46, as illustrated in FIG. 11, which is a photograph of a portion of a sidewall 48 disposed over a mount 40. Reflector 44 is visible. LED 1 is disposed beneath the encapsulant 46 and not visible. As illustrated in FIG. 11, substantially vertical ripples or grooves may be formed on the surface of the sidewall 48, such that the sidewall is corrugated. Ripples 80 may be introduced, or may be a by-product of a process used to formed an angled sidewall 48. For example, when encapsulant 46 is silicone and angled sidewall 48 is cut with a blade, microscopic defects or debris on the blade may form the ripples 80. The ripples may be, for example, on the order of a few microns wide, and spaced on the order of a few microns apart. The ripples or corrugation need not be vertical, it may be angled relative to a major surface of the mount 40. Features formed in a top surface of the encapsulant may also have rippled or corrugated sidewalls, such as the rippled sidewall illustrated in FIG. 11.

Figure 8:
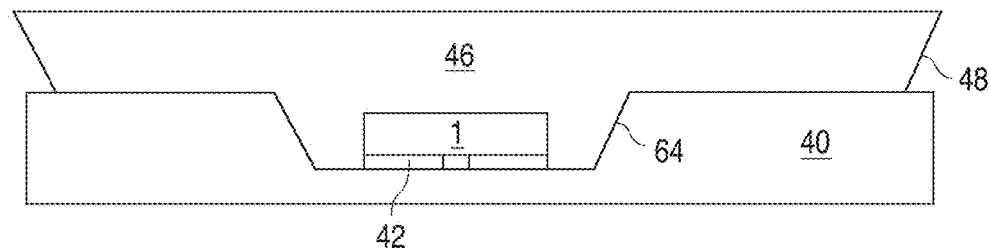
FIG. 8 is a cross sectional view of a UVLED disposed in a reflector cup formed on a mount, and covered with a shaped encapsulant.

FIG. 8 illustrates a device where a reflector cup 64 with reflective sidewalls is formed in the mount, and the UVLED 1 is disposed at the bottom of the reflector cup. As an alternative, rather than a reflector cup that extends down from the top surface of mount, a pedestal that extends upward from the top surface of the mount may be formed, and the UVLED 1 may be disposed on the pedestal.

Figure 9:
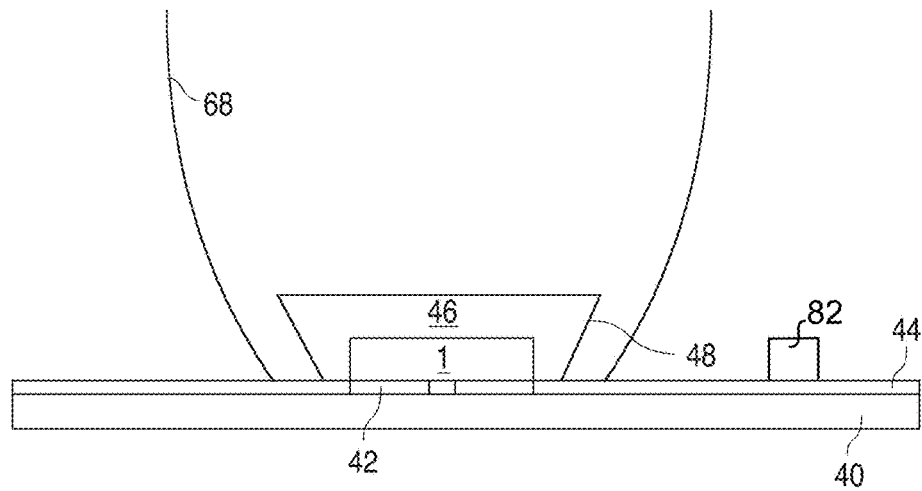
FIG. 9 is a cross sectional view of a UVLED covered with a shaped encapsulant and positioned in a parabolic reflector.

FIG. 9 illustrates a device where the UVLED 1 is disposed within a parabolic reflector 68 with reflective sidewalls. A UVLED 1 covered by a shaped encapsulant 46 is disposed at the center of the parabolic reflector. The parabolic reflector 68 may be any suitable structure such as machined aluminum, Teflon, stainless steel, or a non-reflective material coated with any suitable reflective material. The parabolic reflector 68 may be, for example, a hollow structure that is bolted, glued, or otherwise attached to the mount 40. In some embodiments, rather than having a shaped sidewall 48 as illustrated, the encapsulant may fill the entire bottom of the parabolic reflector 68, and features 52 and/or 60 may be formed in the top surface of the encapsulant.

In some embodiments, one or more chips containing circuitry such as, for example, an electrostatic discharge protection chip may be attached to the mount and electrically connected to the LED 1. Such a chip may be disposed under the encapsulant 46 or outside encapsulant 46, under reflective material 50 in FIG. 4, outside reflector 68 as illustrated in FIG. 9 (chip 82), or in any other suitable position.

Figure 10:
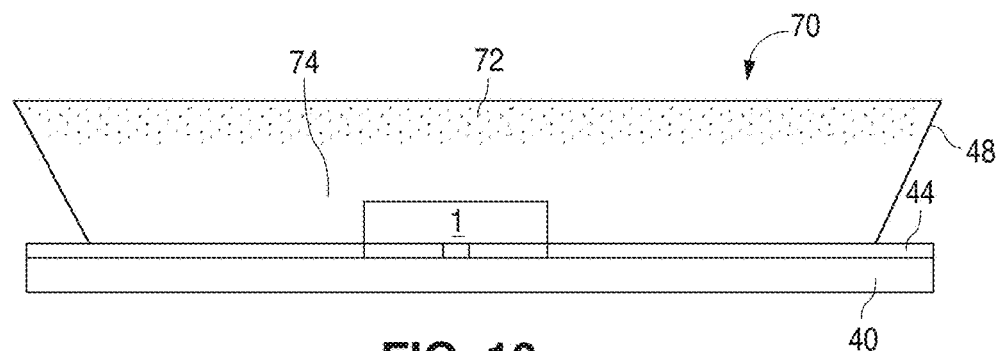
FIG. 10 is a cross sectional view of a UVLED covered with a shaped encapsulant with a graded index of refraction.

FIG. 10 illustrates a device where the encapsulant 70 over the UVLED 1 has regions with different indices of refraction. In some embodiments, the portion 74 of the encapsulant 70 close to the mount 40 has a higher index of refraction than the portion 72 of the encapsulant 70 furthest from the mount. In some embodiments, the index of refraction in the encapsulant 70 is graded across the thickness of the encapsulant, from a highest value nearest the mount, to a lowest value furthest from the mount. In some embodiments, the encapsulant 70 is silicone or other suitable material mixed with bubbles of air or other gases. As the encapsulant is dispensed or otherwise disposed over the UVLED 1, the air bubbles rise to the top. The encapsulant closest to the mount has the lowest concentration of air bubbles, and therefore the highest index of refraction. The encapsulant furthest from the mount has the highest concentration of air bubbles, and therefore the lowest index of refraction. In some embodiments, the encapsulant is silicone or other suitable material mixed with beads, such as quartz beads. Since the quartz beads sink rather than rise, the mount and UVLED 1 may be inverted onto a quantity of encapsulant mixed with beads, such that the highest concentration of beads (and the lowest index of refraction) is furthest from the mount 40, and the lowest concentration of beads (and the highest index of refraction) is closest to the mount.

Having described the invention in detail, those skilled in the art will appreciate that, given the present disclosure, modifications may be made to the invention without departing from the spirit of the inventive concept described herein. In particular, different features and components of the different examples described herein may be used in any of the other examples, or features and components may be omitted from any of the examples. A characteristic of a structure described in the context of one embodiment, may be applicable to any embodiment. Therefore, it is not intended that the scope of the invention be limited to the specific embodiments illustrated and described.

What is being claimed is:

1. A device comprising:
   a light emitting diode (UVLED) comprising a semiconductor structure comprising an active layer disposed between an n-type region and a p-type region, wherein the active layer emits UV radiation;
   a mount, wherein the UVLED is disposed on the mount; and
   a transparent encapsulant disposed over the UVLED, the transparent encapsulant having an angled sidewall, wherein the angled sidewall is freestanding and not in contact with any structure, and wherein the angled sidewall is no more than 1 mm from an edge of the UVLED.

2. The device of claim 1 further comprising a feature formed on a top surface of the encapsulant.

3. The device of claim 2 wherein the feature is a trench disposed between the UVLED and the angled sidewall.

4. The device of claim 2 wherein the feature is a trench with angled sidewalls.

5. The device of claim 2 wherein the feature is a trench that surrounds the UVLED.

6. The device of claim 2 wherein the feature is a trench between 40% and 60% of a thickness of the encapsulant.

7. The device of claim 2 wherein the feature comprises a plurality of holes.

8. The device of claim 2 wherein the feature is formed in a first region of the top surface, wherein a second region of the top surface does not include a feature.

9. The device of claim 2 wherein the feature comprises roughening.

10. The device of claim 1 further comprising a reflector cup formed on a top surface of the mount, wherein the UVLED is disposed within the reflector cup.

11. The device of claim 1 wherein an index of refraction varies across a thickness of the encapsulant.

12. The device of claim 11 wherein the encapsulant comprises a transparent material mixed with one of bubbles and beads.

13. The device of claim 1 further comprising an electrostatic discharge protection chip disposed outside the encapsulant.

14. The device of claim 1 wherein angled sidewall is corrugated.

* * * * *